US006882562B2

(12) United States Patent
Beucler

(10) Patent No.: US 6,882,562 B2
(45) Date of Patent: Apr. 19, 2005

(54) METHOD AND APPARATUS FOR PROVIDING PSEUDO 2-PORT RAM FUNCTIONALITY USING A 1-PORT MEMORY CELL

(75) Inventor: Dale Beucler, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 110 days.

(21) Appl. No.: 10/213,510

(22) Filed: Aug. 7, 2002

(65) Prior Publication Data

US 2003/0081449 A1 May 1, 2003

Related U.S. Application Data

(60) Provisional application No. 60/335,967, filed on Nov. 1, 2001.

(51) Int. Cl.[7] .............................................. G11C 11/00
(52) U.S. Cl. .................... 365/154; 365/233; 365/230.05
(58) Field of Search ................................ 365/154, 233, 365/230.05

(56) References Cited

U.S. PATENT DOCUMENTS

| | | | |
|---|---|---|---|
| 4,893,280 A | 1/1990 | Gelsomini et al. | |
| 5,105,425 A | 4/1992 | Brewer | |
| 5,307,321 A | 4/1994 | Sasai et al. | |
| 5,355,335 A | 10/1994 | Katsuno | |
| 5,790,883 A | 8/1998 | Sugita | |
| 5,991,208 A | 11/1999 | Aipperspach et al. | |
| 5,991,224 A | 11/1999 | Aipperspach et al. | |
| 5,991,233 A * | 11/1999 | Yu | 365/238.5 |
| 5,999,474 A * | 12/1999 | Leung et al. | 365/222 |
| 6,011,730 A | 1/2000 | Sample et al. | |
| 6,011,744 A | 1/2000 | Sample et al. | |
| 6,020,760 A | 2/2000 | Sample et al. | |
| 6,134,154 A * | 10/2000 | Iwaki et al. | 365/189.04 |
| 6,151,258 A | 11/2000 | Sample et al. | |
| 6,166,946 A * | 12/2000 | Naffziger | 365/154 |
| 6,219,284 B1 | 4/2001 | Sample et al. | |
| 6,314,047 B1 | 11/2001 | Keay et al. | |
| 6,377,499 B1 * | 4/2002 | Tobita | 365/222 |
| 6,411,557 B1 * | 6/2002 | Terzioglu et al. | 365/200 |
| 6,480,947 B1 * | 11/2002 | Hasegawa et al. | 711/167 |

* cited by examiner

*Primary Examiner*—Hoai Ho

(57) ABSTRACT

A method and apparatus operable to provide pseudo 2-port RAM functionality using 1-port memory cells. A pseudo 2-port RAM functionality is provided using an array of 1-port memory cells to perform read and write operations during a single clock cycle. Control logic is used to determine when the read and write operations occur. The pseudo 2-port RAM uses the control logic to divide the clock cycle into four phases in accordance with a preferred embodiment. The first phase is used to set up the addresses and register values, the second phase is used to prepare for the read operation, the third phase is used to perform the read operation and prepare for the write operation, and the fourth phase performs the write operation.

18 Claims, 6 Drawing Sheets

METHOD AND APPARATUS FOR PROVIDING PSEUDO 2-PORT RAM FUNCTIONALITY USING A 1-PORT MEMORY CELL

This application claims the benefit of prov. application Ser No. 60/335,967 filed on Nov. 1, 2001.

TECHNICAL FIELD

This invention relates generally to the field of integrated circuit devices and systems, and more specifically to Random Access Memories (RAMs).

BACKGROUND OF THE INVENTION

In applications involving Application Specific Integrated Circuits (ASICs), embedded RAMs are often included for the temporary storage of data. In many applications, it is desirable that these RAMs have the ability to perform a read and a write every clock cycle. This capability is often provided by using a 2-port RAM (also called a dual-port RAM) with one port dedicated to the read operation and the second port dedicated to the write operation. The 2-port RAM has two sets of addresses, data in, data out, and read/write control signals each accessing the same set of 2-port memory cells.

The cost of an ASIC is generally, directly related to its area. Small chip size translates to lower manufacturing cost. However, the ever increasing complexity of operations being performed by ASICs tend to require more and more bits of memory storage, driving up the chip area. Therefore, it is important that the memory cell area be as small as possible to meet the need for increasing RAM bit counts.

A 2-port memory cell is considerably larger than a 1-port memory cell as it may include eight transistors, four bitlines and two wordlines (also referred to as rowlines) as compared to the six transistors, two bitlines, and one wordline often used in the 1-port memory cell. FIG. 1 illustrates the circuit schematics of traditional 1-port and 2-port static memory cells. The 1-port RAM can perform only one read or one write function every clock cycle. The 2-port RAM, although it can perform a read and a write every clock cycle, requires more circuitry to perform the read and write operations and to control the coordination of read and write access to the memory cell. This has a negative effect on the silicon area and therefore the cost of the ASIC. It would be advantageous in the art for a RAM that provides 2-port RAM functionality while using fewer components and taking up less space than the conventional 2-port RAM.

SUMMARY OF THE INVENTION

The present invention discloses a pseudo 2-port random access memory (RAM) method and structure that is able to perform a read and a write operation during a single clock cycle using an array of 1-port memory cells. The pseudo 2-port RAM requires that the read port and the write port be synchronous (use the same clock) with each other, whereas a true 2-port RAM would not have this restriction. The structure of the pseudo 2-port RAM contains an array of 1-port memory cells and a control logic element. The control element manipulates the timing of a system clock internal to the RAM to provide a read operation capability and a write operation capability of the RAM during a single cycle of the system clock.

The method of the present invention divides the clock cycle into a plurality of phases in order to read and write data during a single clock cycle. Four phases are used in the preferred embodiment of the present invention. During the first phase of the clock cycle, read and write flags are set and any write data is registered on the rising edge of the clock cycle. Also during the first phase, bitlines are precharged for a read operation and the read address is decoded so that the correct row and column of the memory array is accessed.

During the second phase of the clock cycle, the decoded rowlines become valid selecting the memory cells to be read. The selected memory cells drive a differential voltage onto one or more bitlines where the sense amp can complete the read in the third phase.

During the third phase of the clock cycle, the sense amps are enabled so that data read from the memory cells can be resolved. The outputs of these sense amps become valid. Also during the third phase, one or more bitlines are precharged for a write operation and the write address is decoded.

During the fourth phase, the rowline corresponding to the decoded write address becomes valid for a write operation, the write drivers are enabled and the selected memory cells are written. After the completion of the final phase of a single clock cycle, new address, control and data inputs are registered on the rising edge of the next clock transition, and the data outputs are updated with the read data.

While it is true that running a 1-port RAM at double the system clock frequency would allow a read and a write per system clock, the pseudo 2-port RAM is a superior solution in several important ways. First, the pseudo 2-port RAM does not require a double frequency clock which can be difficult to generate and distribute around the ASIC. Secondly, all input and output transactions occur with the rising edge of the system clock, the same clock that other blocks within the ASIC use. With a 1-port RAM running at double the clock frequency there would need to be extra care taken at the time domain crossings between the system clock and the double clock. And lastly, the pseudo 2-port RAM has been designed to allow the read operation to use all of phase 2 and part of phase 3 to complete. The read operation is the most critical operation in any RAM that limits the RAM's maximum frequency of operation. The standard 1-port RAM running at double frequency would not be able to take advantage of the extra time and therefore, would have lower performance compared to the pseudo 2-port RAM.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
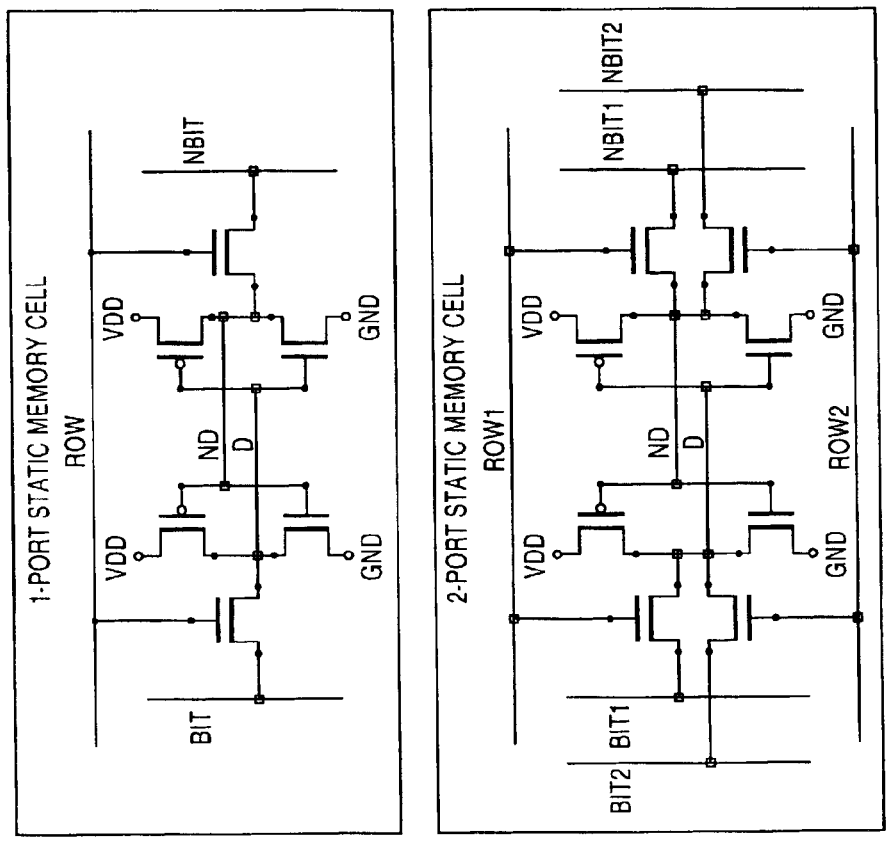
FIG. 1 is a circuit diagram of a 1-port static RAM cell and a 2-port static RAM cell, according to the prior art.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

In many applications involving random access memory, the term "sense amplifier" is abbreviated as "sense amp", while "multiplexer" is abbreviated as "mux", "register" is abbreviated as "reg", "bitlines" are also know as "datalines", and "rowlines" are also know as "wordlines". These abbreviations and the alternate terminology will be used interchangeably herein.

Figure 2:
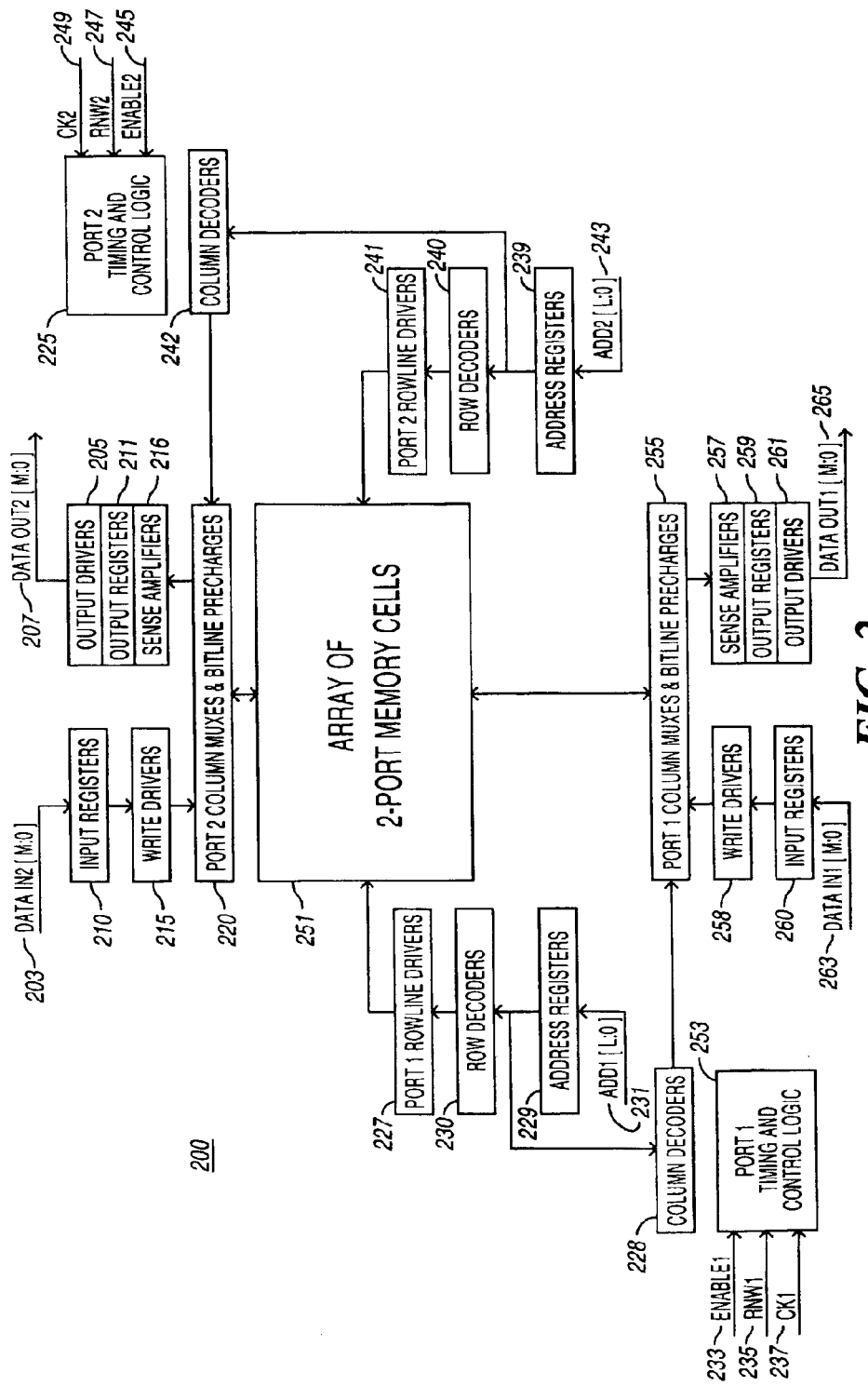
FIG. 2 is a block diagram of a traditional 2-port Static RAM (SRAM), according to the prior art.

Referring now to FIG. 2, a block diagram of a 2-port SRAM 200 is shown, according to the prior art. The 2-port SRAM 200 consists of an array of 2-port memory cells 251, and associated circuitry operable to read or write data once per clock cycle via each of two ports. A first read/write capability is provided by input bus DATA_IN1 263, output bus DATA_OUT1 265, one or more output drivers 261, input registers 260 and output registers 259, sense amplifiers 257 and write drivers 258, and column multiplexers and bitline precharges 255. Addressing for the first read/write capability is provided by an address input ADD1 231, address registers 229 and row decoders 230, column decoders 228, and rowline drivers 227.

Similarly, a second read/write capability is provided by input bus DATA_IN2 203, output bus DATA_OUT2 207, output drivers 205, input registers 210, output registers 211, sense amps 216, write drivers 215, and column muxes and bitline precharges 220. Addressing for the second read/write capability is provided by an address input ADD2 243, address registers 239 and row decoders 240,column decoders 242, and rowline drivers 241.

Using the first input bus DATA_IN1 263 and the first output bus DATA_OUT1 265, data may be written to or read out of the memory cells 251. The column muxes and bitline precharges 255 are coupled to the memory cells 251 and establish connections to the appropriate bitline associated with input address ADD1 231. The rowline drivers 227 are also coupled to the memory array 251 and provide activation for a wordline associated with the memory cell row corresponding to ADD1 231. The sense amp 257 and write driver 258 are coupled to column muxes and bitline precharges 255 and sense amplifier 257 is coupled to output registers 259 while write driver 258 is coupled to input registers 260. The sense amp 257 and write driver 258 handle reading from and writing to the cell specified by ADD1 231. The read or write operation that occurs depends upon the value of a RNW1 flag 235 coupled to a timing and control logic block 253. The data written to the cell or the data read from the cell is stored in input registers 260 and output registers 261, respectively. Input registers 260 and output registers 259 are coupled to the write drivers 258 and sense amps 257, respectively. Output registers 259 are also coupled to output drivers 261, which is coupled to DATA_OUT1 265.

The address contained in ADD1 231 is stored by address registers 229 and decoded by row decoder 230 and column decoder 228. Row decoder 230 is coupled to rowline drivers 227, while rowline drivers 227 are coupled to memory cells 251. The port 1 timing and control 253 is coupled to the enable flag ENABLE1 233, read/write flag RNW1 235, and clock CK1 237. The port 1 timing and control block 253 ensures that the clock input CK1 237 controls the sequence of operations required for a correct read or write operation. This port 1 timing and control block is coupled to each of the blocks associated with the first read/write capability (blocks 227, 228, 229, 230, 255, 257, 258, 259, 260 and 261).

The second read and write capability has a similar structure to the first read and write capability. Using the second input bus DATA_IN2 203 and the second output bus DATA_OUT2 207, data may be written into or read out from the memory cells 251. The column muxes and bitline precharges 220 are coupled to the memory cells 251 and establish connections to the appropriate bitline associated with input address ADD2 243. The rowline drivers 241 are also coupled to the memory array 251 and provide activation for a wordline associated with the memory cell row corresponding to ADD2 243. The sense amp 216 and write driver 215 are coupled to column muxes and bitline precharges 220 and sense amplifier 216 is coupled to output registers 211 while write driver 215 is coupled to input registers 210. The sense amp 216 and write driver block 215 handle reading from and writing to the cell specified by ADD2 243. The read or write operation that occurs depends upon the value of a RNW2 flag 247 coupled to a timing and control logic block 225. The data read from the cell or the data written to the cell is stored in input registers 210 and output registers 211. Input registers 210 and output registers 211 are coupled to the write drivers 215 and sense amps 216, respectively. Output registers 211 are also coupled to output drivers 205, where output drivers 205 are coupled to DATA_OUT2 207.

The address contained in ADD2 243 is stored by address registers 239 and decoded by row decoder 240 and column decoder 242. Row decoder 240 is coupled to rowline drivers 241, while rowline drivers 241 are coupled to memory cells 251. The port 2 timing and control 225 is coupled to the enable flag ENABLE2 245, read/write flag RNW2 247, and clock CK2 249. The port 2 timing and control block 225 ensures that the clock input CK2 249 controls the sequence of operations required for a correct read or write operation. This port 2 timing and control block is coupled to each of the blocks associated with the second read/write capability (blocks 239, 240, 241, 205, 210, 211, 215, 220, 242 and 216).

Figure 3:
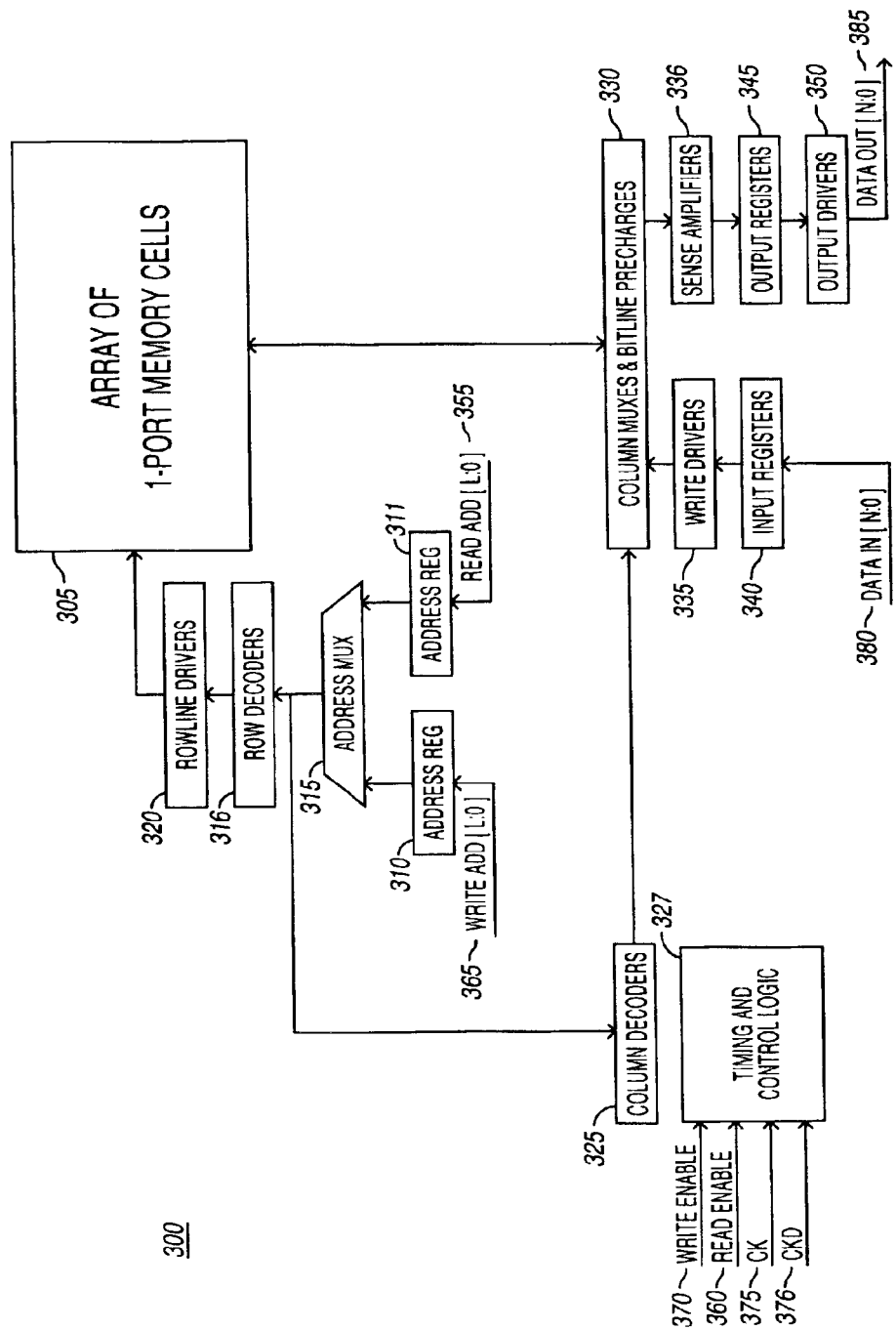
FIG. 3 is a block diagram of a pseudo 2-port SRAM, according to a certain embodiment of the present invention.

Referring now to FIG. 3, a block diagram of a pseudo 2-port SRAM 300 is shown, according to a certain embodiment of the present invention. The pseudo 2-port SRAM 300 comprises an array of 1-port memory cells 305 coupled to a column muxes and bitline precharges block 330, and a rowline drivers block 320, and control logic block 327. The control logic block is coupled to the circuitry required to correctly read and write data. This circuitry comprises the column muxes and bitline precharges 330, sense amps 336 and write drivers 335, input registers 340 and output registers 345, and output drivers 350. The column muxes and bitline precharges 330 are coupled to the memory cells 305 and the sense amps 336 and write drivers 335. The sense amps are further coupled to output registers 345, wherein the output registers 345 are further coupled to output drivers 350. The write drivers 335 are further coupled to input registers 340. Input registers 340 is coupled to input data DATA_IN 380. The output drivers 350 are coupled to output data DATA_OUT 385.

Read address 355 and write address 365, are coupled to address registers 311 and 310 respectively. Address registers 310 and 311 are then coupled to address mux 315. Address mux 315 is coupled to row decoders 316, while row decoders 316 is coupled to rowline drivers 320. Address mux 315 is also coupled to column decoders 325. Column decoders 325 is coupled to the column muxes and bitline precharges 330. The timing and control logic 327, which is operable to provide one or more clocks and one or more control logic signals to the circuitry of the pseudo 2-port SRAM 300, receives as input flags to READ_ENABLE 360, WRITE_ENABLE 370, and a clock, CK 375, and delayed clock, CKD 376.

A particular cell of the array of 1-port memory cells 305 that is accessed is determined by the read enable flag 360, write enable flag 370, read address 355, and write address 365. Clock 375 and delayed clock 376 are used to determine when the read and/or the write occur. In the preferred embodiment of the present invention, depending on the read flag 360 and write flag 370, the RAM will perform a read operation, a write operation, a read and a write operation, or no operation at all, in one clock cycle. The read and/or write addresses are stored in one or more address registers of blocks 310 and 311, and the row and column electrical connections are assigned. After row decode 316 and column decode 325, the appropriate bit lines and wordlines associated with the enabled read or write address are activated using rowline drivers 320 and column muxes. This allows data to be read by sense amp 336 or data to be written using write driver 335. The data to be read or the data to be written is stored in output registers 345 and input registers 340, respectively.

It is noted that one of skill in the art will recognize that one or more of clock 375 and delayed clock 376 may be present, without departing from the spirit and scope of the present invention. In a certain embodiment of the present invention, clock 375 and delayed clock 376 are operable to create the timing signals for the pseudo 2-port RAM 300. It is further noted that output registers 345 need not be present for the correct operation of the pseudo 2-port RAM 300 without departing from the spirit and scope of the present invention. The output data data_out 385 may be acquired using several possible approaches, including an output buffer with no registers, output registers with no buffer, output registers with an output buffer, and output registers with a tristate output buffer. One or more of these or similar designs may be employed in a certain embodiment of the invention without departing from the spirit and scope of the invention.

It should be also noted that one of skill in the art will recognize that the described embodiment of the present invention may have a different functional organization than the block diagram 300 without departing from the spirit and scope of the present invention. As an example, the functionality contained within the blocks of block diagram 300 can be broken into a number of different groupings without departing from the spirit and scope of the present invention.

Figure 4:
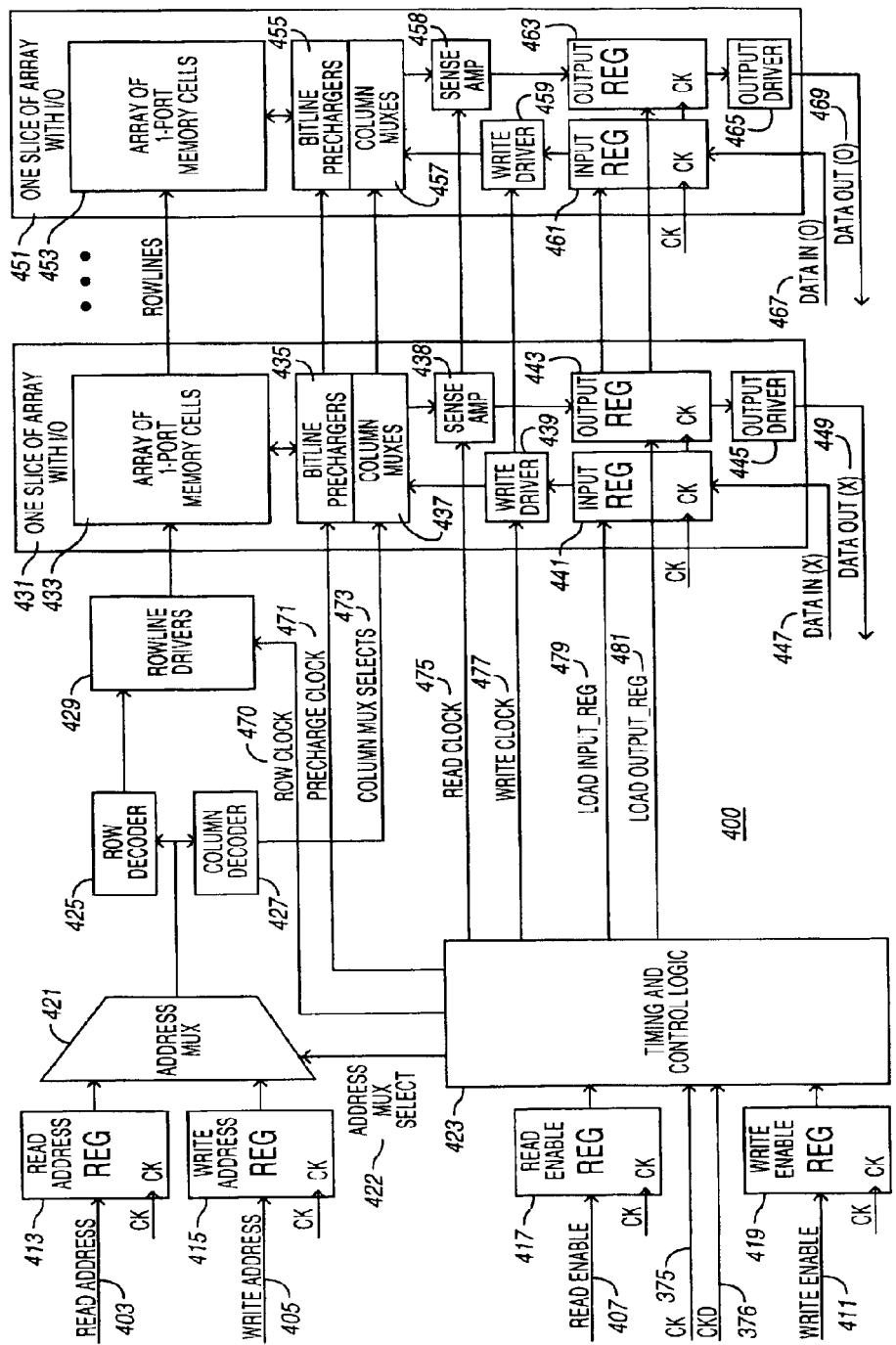
FIG. 4 is a detailed block diagram of a pseudo 2-port SRAM, according to a certain embodiment of the present invention.

Referring now to FIG. 4, a block diagram of a detailed pseudo 2-port SRAM 400 is shown, according to an embodiment of the present invention. Clock 375 and delayed clock 376 are supplied to control logic 423, while clock 375 is supplied to read address register 413, write address register 415, read_enable register 417, write enable register 411 and to the input and output registers of each slice of memory array 305. Two representative slices of memory array 305 are shown in FIG. 4; A first slice 431 and a second slice 451. Clock 375 allows control logic 423 to ensure that the logic devices comprising pseudo 2-port RAM 300 are in synchronization. A read address 403 is stored in read register 413, and a write address is stored in write register 415. The contents of read register 413 and write register 415 are coupled to address mux 421. Control logic 423 is operable to send address mux select flag 422 to address mux 421, thereby allowing address mux 421 to select an appropriate address. This determination is based upon the value of a read enable input 407 and a write enable input 411 coupled to corresponding read enable register 417 and write enable register 419. The contents of read enable register 417 and write enable register 419 are coupled to control logic 423 so that address mux select flag 422 may be correctly set.

The output of address mux 421 is coupled to row decoder 425 and column decoder 427. Row decoder 425 and column decoder 427 determine the row and column of memory array 305 from which data is to be read or written. Row decoder 425 is coupled to rowline drivers 429. Rowline drivers 429, coupled to each slice of memory array 305 enable the wordline in each slice of memory array 305. Rowline drivers 429 are coupled to timing and control logic 423 by row clock 470. Each slice of memory array is represented in FIG. 4 by memory slice 433 and memory slice 453. The output of column decoder 427 is coupled to each column mux of each slice of memory array 305, wherein each column mux is represented in FIG. 4 by column mux 437 and column mux 457. Column mux 437 and column mux 457 are coupled to corresponding bitline precharge block 435 and bitline precharge block 455. A precharge clock flag 471 is coupled from control logic 423 to each bitline precharge represented by bitline precharge 435 and bitline precharge 455. Precharge clock flag 471 controls the timing that enables the bitline for each slice of memory array 305 to be precharged for reading and writing.

Data values can be read into memory array 305 using data inputs coupled to each slice of memory array 305. Representative data inputs are shown as data input 447 and data input 467 in FIG. 4. Data values can also be read out of memory array 305 using data outputs coupled to each slice of memory array 305. Representative data outputs are shown in FIG. 4 as data output 449 and data output 469. Data input 447 and data input 467 are coupled to register 441 and register 445, respectively. Data output 449 and data output 469 are coupled to corresponding output driver block 445 and output driver block 465. Output driver block 445 and output driver block 465 are coupled to output register 443 and output register 463, respectively. Output register 443 is coupled to sense amplifier 438 and input register 441 is coupled to write driver 439, where sense amp 438 and write driver 439 is coupled to column mux 437. Output register 463 is coupled to sense amp 458 and input register 463 is coupled to write driver 459, where sense amp 458 and write driver 459 are coupled to column mux 457. It should be noted that the functionality represented by memory slice 431 and memory slice 451 are similar to every other slice of memory array 305.

Control logic 423 provides a read clock flag 475, write clock flag 477, load input register flag 479, and load output register flag 481, coupled to each slice of memory array slices 431 and 451. Load input register flag 479 determines when write data is placed into input register 441 and input register 461. Load output register flag 481 determines when read data is placed into output register 443 and output register 463. Read clock 475 and write clock 477 determine when the sense amps and write drivers of memory array 305, represented in FIG. 4 by sense amp and write driver 439 and sense amp and write driver 459, read data from or write data to memory array 305. It should be noted that one of skill in the art will recognize that the coupling between control logic 423 and slice 431 is operable to be the same as the coupling between control logic 423 and every other slice of memory array 305.

Figure 5:
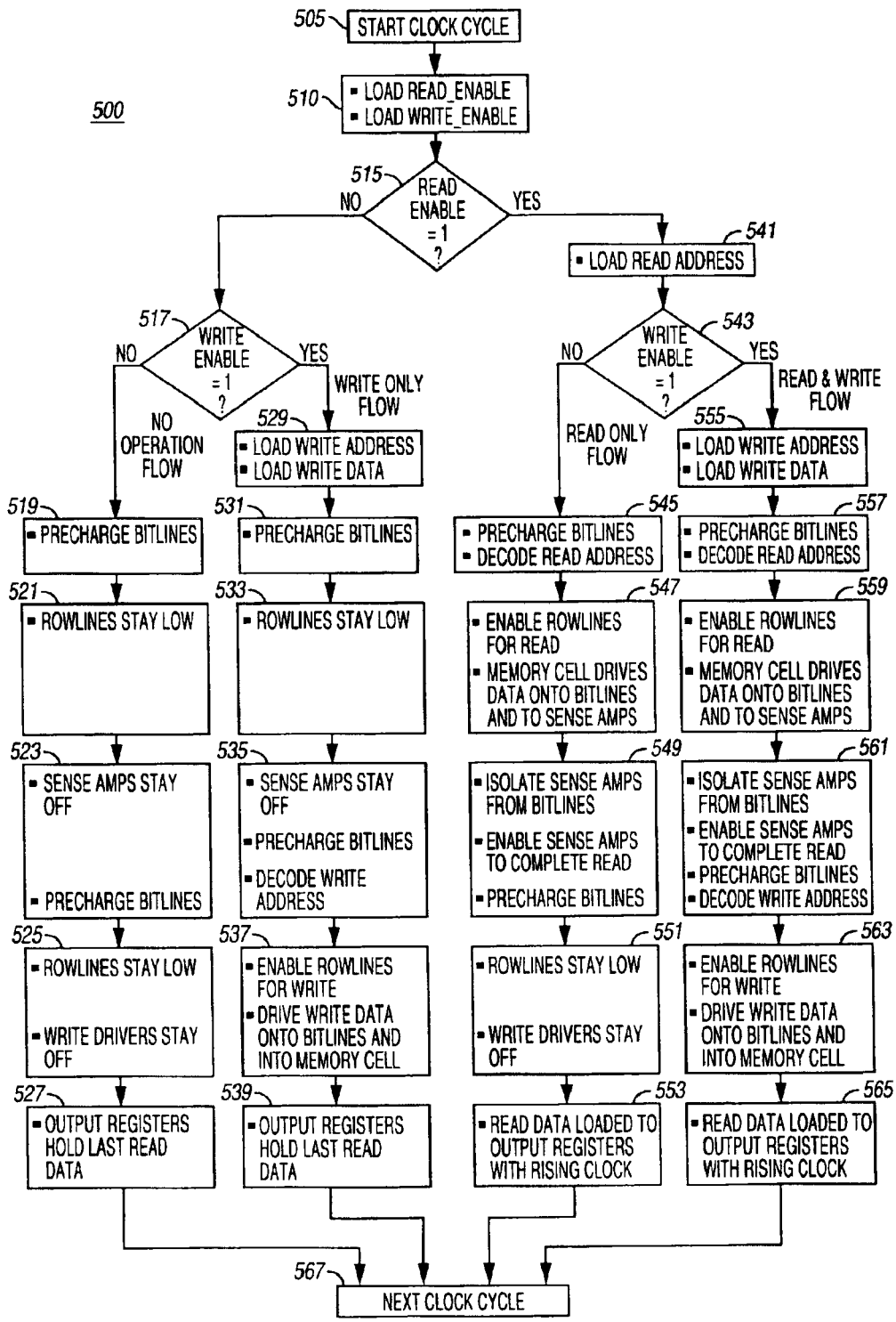
FIG. 5 is a detailed flowchart of the internal timing of a pseudo 2-port SRAM, according to a certain embodiment of the present invention.

Referring now to FIG. 5, a detailed flowchart of the internal timing of a pseudo 2-port SRAM is shown, according to a certain embodiment of the present invention. At the start of a clock cycle (block 505), read_enable 407 and write enable 411 are set (block 510). If read is enabled (block 515), then read address 403 is loaded (block 541).

If write is also enabled (block 543), then write address 405 is loaded and write data 447 and 467 is loaded (block 555). The bitlines are then precharged and read address 403 is decoded (block 557). Next, the rowlines are enabled for read and memory cell array 305 drives data to be read onto bitlines and sense amps 438 and 458 (block 559). Sense amps 438 and 458 are then isolated from bitlines and sense amps 438 and 458 are enabled to allow the read operation to complete. The bitlines are precharged and write address 405 is decoded (block 561). Next, rowlines are enabled for write, and write data 447 and 467 is driven onto bitlines and into a memory cell of the memory cell array 305 (block 563). Finally, read data 449 and 469 is loaded to output registers 443 and 463 with the next rising clock (block 565). This starts the next clock cycle 567, thereby repeating the process started in 505.

If, in block 543, read is enabled but write is not enabled, then the bitlines are precharged and read address 403 is decoded (block 545). Next, the rowlines are enabled for read and memory cell array 305 drives data to be read onto bitlines and sense amps 438 and 458 (block 547). Sense amps 438 and 458 are then isolated from bitlines and sense amps 438 and 458 are enabled to allow the read operation to complete. The bitlines are then precharged (block 549). Since write is not enabled, the rowlines stay low and write drivers stay off (block 551). Finally, read data 449 and 469 is loaded to output registers 443 and 463 with the next rising clock (block 553). This starts the next clock cycle 567, thereby repeating the process started in 505.

If, in block 515, read is not enabled, then if write is enabled (block 517), then write address 405 is loaded and write data 447 and 467 is loaded (block 529). The bitlines are then precharged (block 531), the rowlines stay low (block 533), the sense amps 438 and 458 stay off and the bitlines are precharged and the write address 405 is decoded (block 535). Next, rowlines are enabled for write, and write data 447 and 467 is driven onto bitlines and into a memory cell of the memory cell array 305 (block 537). Finally, output registers 443 and 463 hold the last data read (block 539). This starts the next clock cycle 567, thereby repeating the process started in 505.

If, in block 517 write is not enabled, then since read is also not enabled, the bitlines are precharged (block 519), the rowlines stay low (block 521), sense amps 438 and 458 stay off and the bitlines are precharged (block 523), the rowlines stay low and write drivers 439 and 459 stay off (block 525). Finally, the output registers 443 and 463 hold the last data read (block 527). This starts the next clock cycle 567, thereby repeating the process started in 505.

In a certain embodiment of the present invention, all operations within a single block in FIG. 5 are concurrent. It is also noted that this may not be necessary in other embodiments of the present invention.

Figure 6:
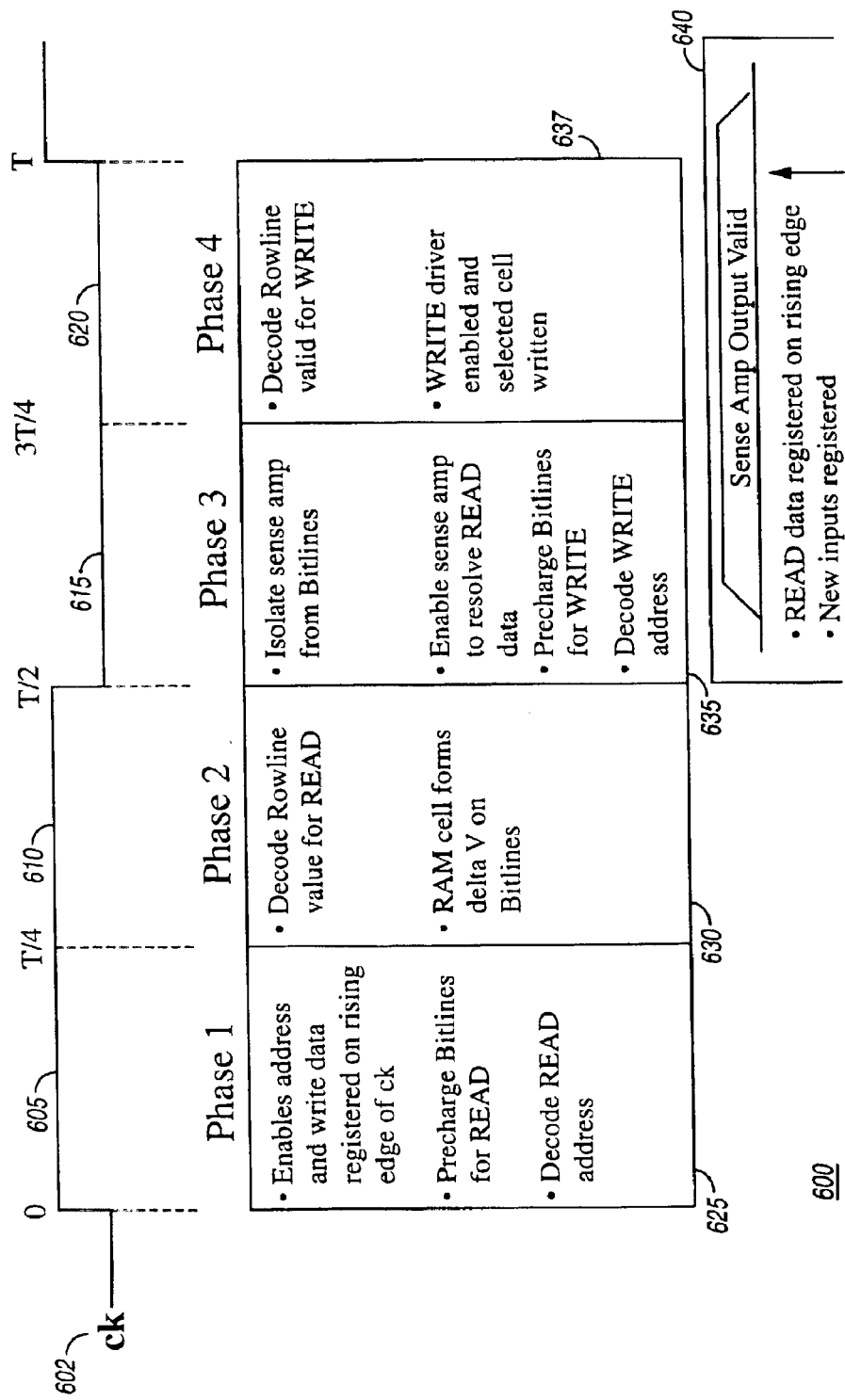
FIG. 6 is a simplified timing diagram of the internal timing of a pseudo 2-port SRAM, according to a certain embodiment of the present invention.

Referring now. to FIG. 6, a timing diagram 600 for operation of pseudo 2-port SRAM 300 is shown, according to a certain embodiment of the present invention. A Clock signal 602 with period T is separated into four intervals. In the preferred embodiment of the present invention, these four intervals have equal duration. During a first interval 605 from (relative) time 0 to time T/4, a first phase 625 of operation occurs. During the first phase 625, read enable flags 360 and write enable flags 370 are set, read address 355 and write address 365 are registered, and write data 380 are registered on a rising edge of clock signal 602. Also during the first phase 625, bitlines, represented by bitline precharge 435 and bitline precharge 455, are precharged for a read operation, and read address 403 is row decoded 425 and column decoded 427. During a second interval 610 from time T/4 until time T/2, a second phase 630 of operation occurs. During the second phase 630 rowlines, previously decoded in the first phase 630 or the second phase 625, become valid for the read operation. Also during the second phase selected memory cells drive differential read data onto one or more bitlines for the read operation. During a third interval 615 from time T/2 to 3T/4, a third phase 635 of operation occurs. During the third phase 635 one or more sense amps, represented by block 438 and block 458, are isolated from the one or more bitlines, and the one or more sense amps are enabled to resolve read data. Also during the third phase 635, one or more bitlines are precharged for the write operation and a write address is decoded. During the third phase 635, the one or more sense amp outputs, corresponding to block 443 and block 463, becomes valid 640.

During a fourth interval 620 from 3T/4 to T, a fourth phase 602 of operation occurs. During the fourth phase 637 the decoded rowline becomes valid for a write operation, the write drivers are enabled and the selected cells are written. In the preferred embodiment of the present invention, the one or more sense amps outputs remain valid during the fourth phase 637. After the completion of the fourth phase, new read data are registered on the rising edge of the next clock transition, and new inputs are registered. In the preferred embodiment of the present invention, clock signal 602 is high from time 0 to time T/2 and low from time T/2 to time T although one of skill in the art will recognize that clock signal 605 could have opposite polarity without departing from the spirit and scope of the present invention.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A random access memory (RAM) having a plurality of one-port memory cells and a control logic element operable to manipulate timing of a system clock internal to the RAM to provide each one-port memory cell of the plurality of one-port memory cells a read operation capability and a write operation capability during a single cycle of the system clock wherein at least a portion of the read operation capability occurs concurrently with the write operation capability.

2. The apparatus of claim 1, wherein the random access memory is a static random access memory (SRAM).

3. The apparatus of claim 1, wherein the read operation capability occurs prior to the write operation capability.

4. The apparatus of claim 1, the random access memory further comprising:
   a final decode and one or more column muxes, coupled to the plurality of one port memory cells;
   one or more sense amps, coupled to the final decode and coupled to the one or more column muxes;
   one or more write drivers, coupled to the final decode and coupled to the one or more column muxes;
   one or more input registers coupled to the one or more write drivers, said one or more input registers operable to be coupled to one or more input data; and one or more output registers coupled to the one or more sense amps, said one or more output registers operable to be coupled to one or more output data.

5. The apparatus of claim 4, wherein the one or more output registers are coupled to one or more output drivers prior to being coupled to the one or more output data.

6. The apparatus of claim 4, wherein the control logic element is coupled to one or more of:

the final decode and the one or more column muxes;

the one or more sense amps;

the one or more write drivers;

the one or more input registers; and the one or more output registers.

7. The apparatus of claim 6, wherein one or more timing signals and one or more control signals of the control logic element are operable to be generated using one or more of a system clock and a delayed system clock.

8. The apparatus of claim 1, the random access memory further comprising:

plurality of bitline precharges and a plurality of rowline drivers, said plurality of bitline precharges and plurality of rowline drivers coupled to the plurality of one port memory cells;

one or more row decoders and one or more column decoders, coupled to the plurality of bitline precharges and the plurality of row drivers; and one or more address registers, coupled to the one or more row decoders and the one or more column decoders and the plurality of row drivers, said one or more address registers further coupled to a read address and a write address.

9. The apparatus of claim 8, wherein the control logic element is coupled to one or more of:

the plurality of bitline precharges and the one or more rowline drivers;

the one or more row decoders and the one or more column decoders; and one or more address registers.

10. A random access memory (RAM) capable of performing one or more of a one or more read operations and a one or more write operations during a single cycle of a clock signal, wherein a read operation of the one or more read operations and a write operation of the one or more write operations use a one-port memory cell of a plurality of one-port memory cells, comprising a control logic element of the RAM operative to control a timing of operation of a read functionality of the one-port memory cell and a write functionality of the one-port memory cell, a sense amplifier element coupled to the one-port memory cell to enable a read operation and a write driver element coupled to the one-port memory cell to enable a write operation, wherein the read operation and the write operation occur during the single cycle of the clock signal and wherein at least a portion of said read operation occurs concurrently with said write operation.

11. The apparatus of claim 10, wherein the RAM is a static RAM (SRAM).

12. The apparatus of claim 10, wherein the clock signal and one or more control signals of the control logic element are operable to be generated using one or more of a system clock and a delayed system clock.

13. The apparatus of claim 12, wherein the system clock is provided to one or more of:

one or more read enable registers;

one or more write enable registers;

one or more read addresses;

one or more write addresses;

one or more input registers; and one or more output registers.

14. The apparatus of claim 10, wherein the read functionality further comprises:

a plurality of bitline precharges and a plurality of rowline drivers, said plurality of bitline precharges and plurality of rowline drivers coupled to the plurality of one port memory cells;

one or more row decoders and one or more column decoders, said one or more row decoders coupled to the plurality of rowline drivers and said one or more column decoders coupled to the plurality of bitline precharges;

one or more address registers, coupled to the one or more column decoders and coupled to the one or more row decoders, said one or more address registers further coupled to a read address and a write address;

one or more sense amps, coupled to the plurality of bitline precharges and coupled to the one or more output registers; and the one or more output registers operable to be coupled to one or more output data.

15. The apparatus of claim 14, wherein the one or more output registers are coupled to one or more output drivers prior to being coupled to the one or more output data.

16. The apparatus of claim 14, wherein the control logic element is coupled to one or more of:

the plurality of bitline precharges;

the one or more address registers;

the one or more row decoders and the one or more column decoders;

the one or more row drivers;

the one or more sense amps; and the one or more output registers.

17. The apparatus of claim 10, wherein the write functionality further comprises:

a plurality of bitline precharges and a plurality of rowline drivers, said plurality of bitline precharges and plurality of row drivers coupled to the plurality of one port memory cells;

one or more row decoders and one or more column decoders, coupled to the plurality of rowline drivers and the plurality of bitline precharges;

one or more address registers, coupled to the one or more row decoders and coupled to the one or more column decoders, said one or more address registers further coupled to a read address and a write address;

one or more write drivers, coupled to the plurality of bitline precharges and coupled to one or more input registers; and the one or more input registers operable to be coupled to one or more input data.

18. The apparatus of claim 17, wherein the control logic element is coupled to one or more of:

the plurality of bitline precharges and the one or more rowline drivers;

one or more address registers;

the one or more row decoders and the one or more column decoders;

the one or more write drivers; and the one or more input registers.

* * * * *